United States Patent
Hori et al.

(10) Patent No.: US 12,176,399 B2
(45) Date of Patent: Dec. 24, 2024

(54) METHOD OF MANUFACTURING A SILICON CARBIDE EPITAXIAL SUBSTRATE

(71) Applicant: SUMITOMO ELECTRIC INDUSTRIES, LTD., Osaka (JP)

(72) Inventors: Tsutomu Hori, Osaka (JP); Takaya Miyase, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 406 days.

(21) Appl. No.: 17/812,814

(22) Filed: Jul. 15, 2022

(65) Prior Publication Data
US 2022/0367643 A1    Nov. 17, 2022

Related U.S. Application Data

(62) Division of application No. 16/636,750, filed as application No. PCT/JP2018/017038 on Apr. 26, 2018, now abandoned.

(30) Foreign Application Priority Data
Aug. 24, 2017 (JP) ................. 2017-161249

(51) Int. Cl.
*H01L 29/16* (2006.01)
*H01L 29/04* (2006.01)
*H01L 29/32* (2006.01)

(52) U.S. Cl.
CPC ........ *H01L 29/1608* (2013.01); *H01L 29/045* (2013.01); *H01L 29/32* (2013.01)

(58) Field of Classification Search
CPC ............... H01L 29/1608; H01L 29/045; H01L 21/02664; H01L 21/02529;
(Continued)

(56) References Cited

U.S. PATENT DOCUMENTS

| 8,859,387 B2 | 10/2014 | Honke et al. |
| 2009/0114148 A1 | 5/2009 | Stahlbush et al. |

(Continued)

FOREIGN PATENT DOCUMENTS

| JP | H11-274257 | 10/1990 |
| JP | 2013-112575 | 6/2013 |
| JP | 2016-183108 | 10/2016 |

OTHER PUBLICATIONS

Mahadik, Nadeemulah A et al., "Observation of stacking faults from basal plane dislocations in highly doped 4H-SiC epilayers", Applied Physics Letters, Jan. 23, 2012, vol. 100, No. 4, p. 042102.
(Continued)

*Primary Examiner* — Khaja Ahmad
*Assistant Examiner* — Sun Mi Kim King
(74) *Attorney, Agent, or Firm* — IPUSA, PLLC

(57) ABSTRACT

A method of manufacturing a silicon carbide epitaxial substrate includes: preparing a silicon carbide single-crystal substrate having a polytype of 4H and having a principal surface inclined at an angle θ from a {0001} plane in a <11-20> direction; growing a silicon carbide epitaxial layer on the principal surface having a basal plane dislocation, the basal plane dislocation having a portion extending in a <1-100> direction and a portion extending in a <11-20> direction; and irradiating the silicon carbide epitaxial layer with an ultraviolet light having a predetermined power and a predetermined wavelength for a predetermined period of time to stabilize the basal plane dislocation. After the irradiating, the basal plane dislocation does not move even when the basal plane dislocation is irradiated with an ultraviolet light having a power of 270 mW and a wavelength of 313 nm for 10 seconds.

5 Claims, 7 Drawing Sheets

(58) Field of Classification Search
CPC ......... H01L 21/02378; H01L 21/02433; H01L 21/0262; H01L 29/32; C30B 29/36
See application file for complete search history.

(56) References Cited

U.S. PATENT DOCUMENTS

| | | | |
|---|---|---|---|
| 2014/0054609 A1 | 2/2014 | Burk et al. | |
| 2017/0092724 A1* | 3/2017 | Mahadik | H01L 21/0262 |
| 2019/0331603 A1* | 10/2019 | Kamei | C30B 25/02 |
| 2019/0376206 A1* | 12/2019 | Fukada | H01L 21/02378 |

OTHER PUBLICATIONS

Myers-Ward et al., "Spontaneous Conversion of Basal Plane Dislocations in 4° Off-Axis 4H-SiC Epitaxial Layers", Cryst. Growth Des. 2014, 14, pp. 5331-5338. (Year : 2014).
Matsuhata et al., "Analysis of Dislocation Structures in 4H-SiC by Synchrotron X-Ray Topography", Electr Eng Jpn, 197(3): 3-17, Jul. 2016 (Year: 2016).

\* cited by examiner

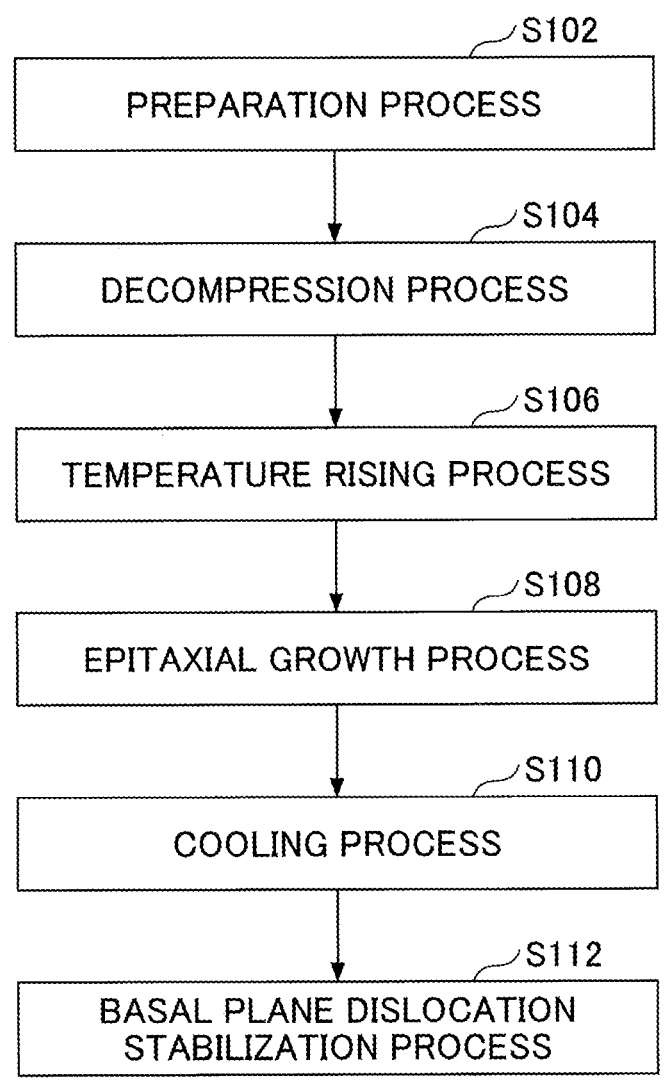

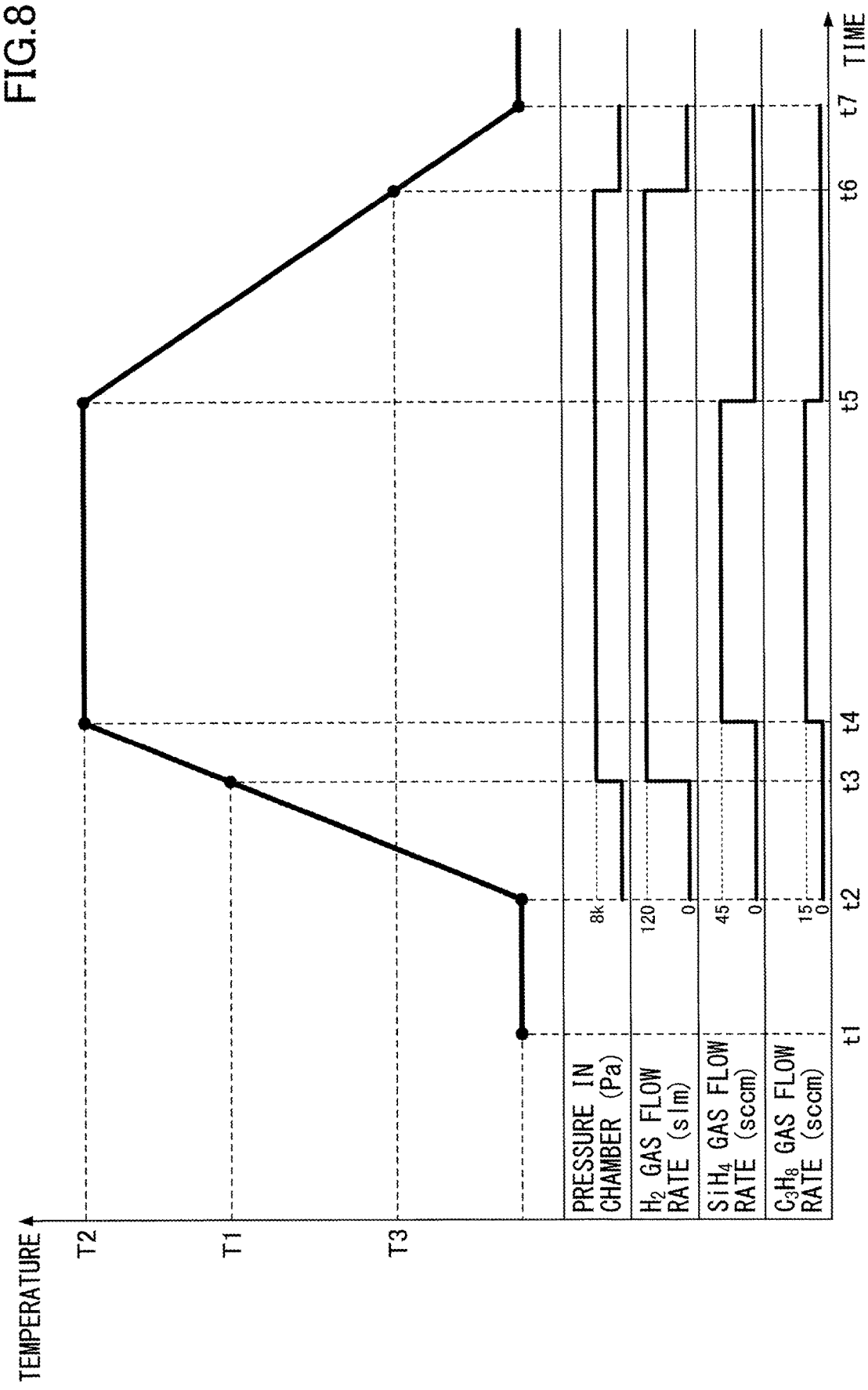

METHOD OF MANUFACTURING A SILICON CARBIDE EPITAXIAL SUBSTRATE

CROSS-REFERENCES TO RELATED APPLICATIONS

This application is a divisional application of and claims the benefit of priority under 35 U.S.C. 120 to patent application Ser. No. 16/636,750 filed on Feb. 5, 2020, which is a national stage application of PCT International Application PCT/JP2018/017038 filed on Apr. 26, 2018, which designates the U.S. and is based upon and claims priority to Japanese Patent Application No. 2017-161249, filed on Aug. 24, 2017. The contents of these applications are incorporated herein by reference in their entirety.

TECHNICAL FIELD

The present disclosure relates to a silicon carbide epitaxial substrate.

BACKGROUND ART

For a method of manufacturing a semiconductor device using a silicon carbide epitaxial substrate, a manufacturing method by which the yield rate can be enhanced is disclosed (for example, Patent Document 1).

PRIOR ART DOCUMENT

Patent Document

[Patent Document 1] Japanese Laid-open Patent Publication No. 2013-112575

SUMMARY OF THE INVENTION

According to one aspect of the present embodiment, a silicon carbide epitaxial substrate includes: a silicon carbide single-crystal substrate having a polytype of 4H and having a principal surface inclined at an angle θ from a {0001} plane in a <11-20> direction; and a silicon carbide epitaxial layer provided on the principal surface and having a basal plane dislocation. Even when the basal plane dislocation is irradiated with an ultraviolet light having a power of 270 mW and a wavelength of 313 nm for 10 seconds, the basal plane dislocation does not move.

According to another aspect of the present embodiment, a method of manufacturing a silicon carbide epitaxial substrate includes: preparing a silicon carbide single-crystal substrate having a polytype of 4H and having a principal surface inclined at an angle θ from a {0001} plane in a <11-20> direction; growing a silicon carbide epitaxial layer on the principal surface having a basal plane dislocation, the basal plane dislocation having a portion extending in a <1-100> direction and a portion extending in a <11-20> direction; and irradiating the silicon carbide epitaxial layer with an ultraviolet light having a predetermined power and a predetermined wavelength for a predetermined period of time to stabilize the basal plane dislocation; wherein after the irradiating, the basal plane dislocation does not move even when the basal plane dislocation is irradiated with an ultraviolet light having a power of 270 mW and a wavelength of 313 nm for 10 seconds.

BRIEF DESCRIPTION OF THE DRAWINGS

FIG. 6 is a flowchart schematically illustrating a method for manufacturing the silicon carbide epitaxial substrate according to one aspect of the present disclosure;

FIG. 8 is a timing chart illustrating an example of temperature control and gas flow rate control in the film deposition apparatus.

EMBODIMENT FOR CARRYING OUT THE INVENTION

Figure 1:
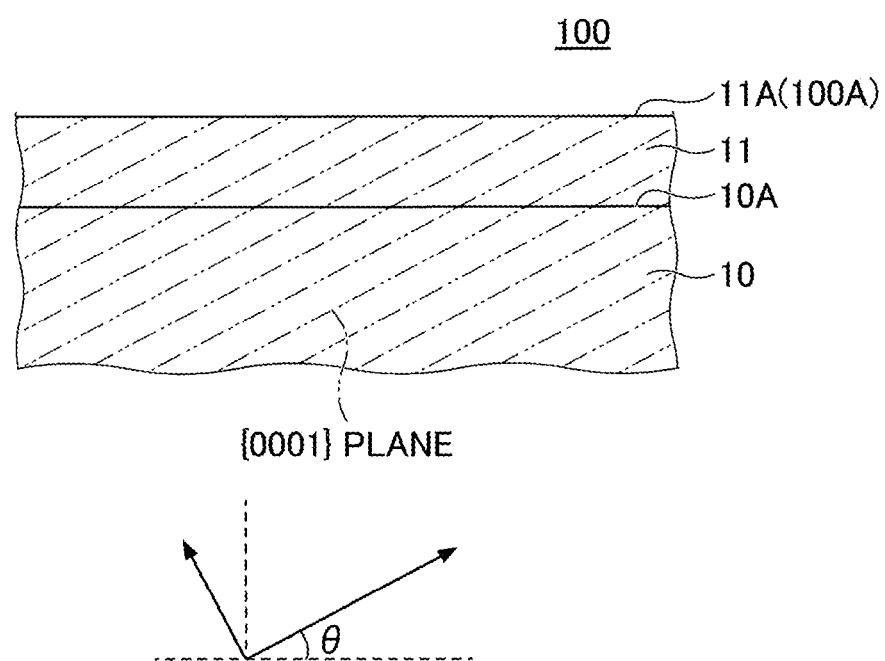
FIG. 1 is a partial cross-sectional view schematically illustrating a silicon carbide epitaxial substrate according to one aspect of the present disclosure.

The present disclosure has an object to provide a silicon carbide epitaxial substrate in which a basal plane dislocation does not move even when being irradiated with an ultraviolet light.

According to the present disclosure, it is possible to provide a silicon carbide epitaxial substrate in which a basal plane dislocation does not move even when being irradiated with an ultraviolet light.

In the following, an embodiment to be carried out will be described. Note that the same reference characters are allotted to the same members and the like so that their descriptions are omitted.

Description of Embodiment of the Present Disclosure

To begin with, aspects of the present disclosure are listed and described below. In the following description, the same reference characters are allotted to the same or corresponding elements and the same descriptions thereof are not repeated. In addition, regarding crystallographic denotation herein, an individual orientation, a group orientation, an individual plane, and a group plane are indicated by [ ], < >, ( ), and { }, respectively. Here, although a crystallographically negative index is usually expressed by a number with a bar "–" thereabove, a negative sign herein precedes a number to express a crystallographically negative index in this specification. In addition, the epitaxial growth of the present disclosure is a homoepitaxial growth.

[1] A silicon carbide epitaxial substrate according to one aspect of the present disclosure includes: a silicon carbide single-crystal substrate having a polytype of 4H and having a principal surface inclined at an angle θ from a {0001} plane in a <11-20> direction; and a silicon carbide epitaxial layer provided on the principal surface and having a basal plane dislocation, wherein even when the basal plane dislocation is irradiated with an ultraviolet light having a power of 270 mW and a wavelength of 313 nm for 10 seconds, the basal plane dislocation does not move.

As a result of research, the inventors of the present application have found, in a silicon carbide epitaxial substrate in which a silicon carbide epitaxial layer is formed on a silicon carbide single-crystal substrate, a basal plane dislocation that moves on the surface of the silicon carbide epitaxial layer upon being irradiated with an ultraviolet light having a wavelength of 313 nm. In a case where a semiconductor device is manufactured by using a silicon carbide epitaxial substrate in which such a basal plane dislocation is present, there may be a possibility that the basal plane dislocation moves during a proves of manufacturing the semiconductor device, which may decrease the reliability of the semiconductor device to be manufactured.

Furthermore, the inventors of the present application have continued research and found that, upon irradiation with an ultraviolet light having a predetermined power for a predetermined time or longer, the movement of a basal plane dislocation moving on the surface of the silicon carbide epitaxial layer is stopped, and the position of the basal plane dislocation is stabilized. In such a silicon carbide epitaxial substrate in which the position of the basal plane dislocation is stabilized, even when the surface of the silicon carbide epitaxial layer is further irradiated with an ultraviolet light having a power of 270 mW and a wavelength of 313 nm for 10 seconds, the basal plane dislocation does not move. Therefore, by using such a silicon carbide epitaxial substrate to manufacture a semiconductor device, the reliability of the semiconductor device can be enhanced.

[2] A diameter of the silicon carbide single-crystal substrate is greater than or equal to 150 mm.

[3] The angle θ is greater than 0° and less than or equal to 6°.

Details of Embodiment of the Present Disclosure

In the following, an embodiment of the present disclosure (which is hereinafter referred to as the "present embodiment") will be described in detail, but the present embodiment is not limited to the following.

Silicon Carbide Epitaxial Substrate

In the following, a silicon carbide epitaxial substrate 100 according to the present embodiment will be described.

FIG. 1 is a cross-sectional view illustrating an example of a structure of the silicon carbide epitaxial substrate 100 according to the present embodiment. The silicon carbide epitaxial substrate 100 according to the present embodiment includes a silicon carbide single-crystal substrate 10 having a principal surface 10A inclined at an off angle θ from a predetermined crystal plane, and a silicon carbide epitaxial layer 11 famed on the principal surface 10A of the silicon carbide single-crystal substrate 10. The predetermined crystal plane is preferably a (0001) plane or a (000-1) plane.

Note that a polytype of silicon carbide in the silicon carbide single-crystal substrate 10 is a 4H. This is because the 4H polytype silicon carbide excels the other polytypes in electron mobility, dielectric breakdown strength, and the like. The diameter of the silicon carbide single-crystal substrate 10 is greater than or equal to 150 mm (e.g., greater than or equal to 6 inches). This is because increasing the diameter has an advantage in reducing the cost of manufacturing a semiconductor device. In the silicon carbide single-crystal substrate 10, the principal surface 10A is inclined with respect to the {0001} plane at an off angle θ of 4° in the <11-20> direction. Note that according to the present embodiment, the off angle θ may exceed 0° and may be 6° or less.

In the silicon carbide epitaxial substrate 100 according to the present embodiment, even when the surface 100A of the silicon carbide epitaxial substrate 100 is irradiated with an ultraviolet light having a power of 270 mW and a wavelength of 313 nm for 10 seconds, the basal plane dislocation does not move. Note that according to the present embodiment, a surface 11A of a silicon carbide epitaxial layer 11 becomes the surface 100A of the silicon carbide epitaxial substrate 100.

Basal Plane Dislocation

Figure 2A:
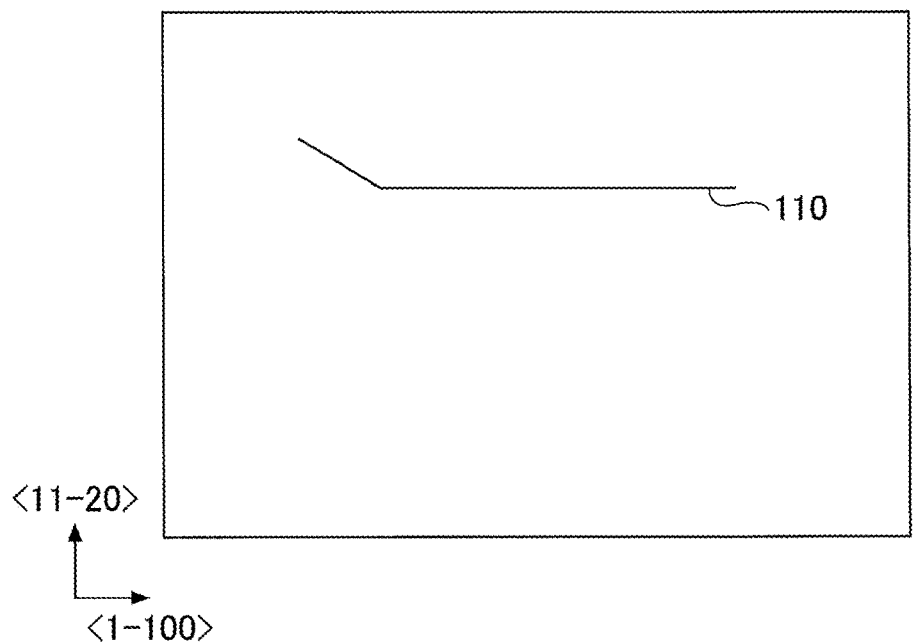
FIG. 2A is an explanatory diagram (1) of a basal plane dislocation whose position is moved by irradiation with an ultraviolet light.
Figure 2B:
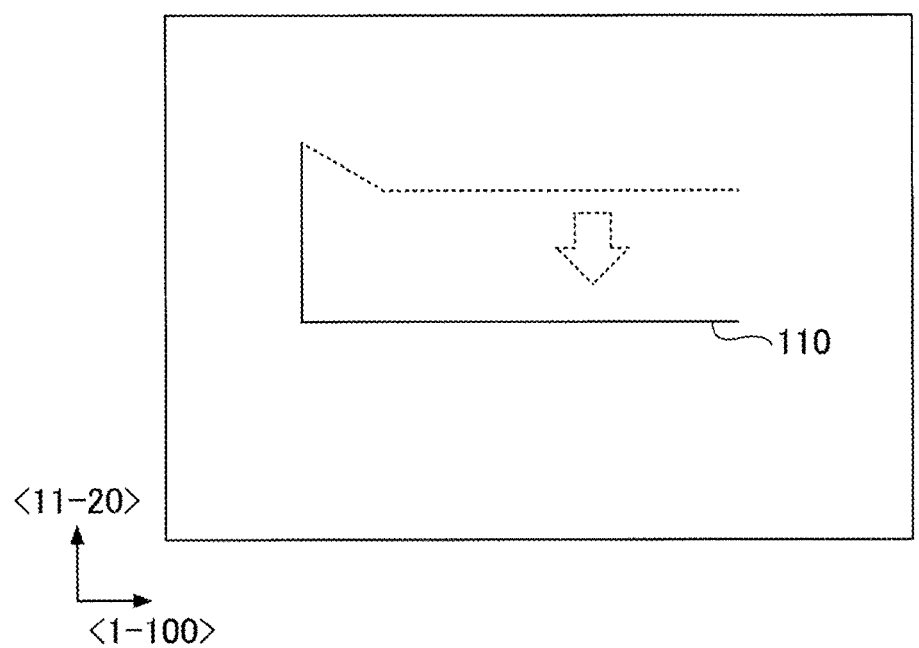
FIG. 2B is an explanatory diagram (2) of the basal plane dislocation whose position is moved by irradiation with an ultraviolet light.

Next, a basal plane dislocation of the silicon carbide epitaxial substrate 100 according to the present embodiment will be described. As described above, as a result of researching silicon carbide epitaxial substrates, the inventors of the present application have found that, among basal plane dislocations that are present in silicon carbide epitaxial substrates, a basal plane dislocation is present that moves upon being irradiated with an ultraviolet light. Specifically, upon the surface of the silicon carbide epitaxial layer 11 of the silicon carbide epitaxial substrate 100 being irradiated with an ultraviolet light having a wavelength of 313 nm, a basal plane dislocation 110 presenting at the position illustrated in FIG. 2A moves in the direction indicated by the dashed arrow in FIG. 2B. Although the basal plane dislocation 110 illustrated in FIGS. 2A and 2B is a basal plane dislocation that long extends in the <1-100> direction, it was confirmed that, upon being irradiated with an ultraviolet light having a wavelength of 313 nm, the basal plane dislocation 110 parallel moves in the <11-20> direction, maintaining a state of extending in the <1-100> direction. Thus, when a basal plane dislocation in a silicon carbide epitaxial substrate is moved by irradiation with an ultraviolet light, at the time of manufacturing a semiconductor device, the basal plane dislocation may move to an area where the semiconductor device is formed, resulting in a decrease in the characteristics and a decrease in the yield rate of the semiconductor device to be manufactured. At the time of manufacturing a semiconductor device, a process in which a basal plane dislocation possibly moves may be a process such as a lithography process in which an exposure device performs irradiation with an ultraviolet light or the like or a process of deposition or substrate processing by plasma in which an ultraviolet light is radiated.

Furthermore, as a result of researching silicon carbide epitaxial substrates, the inventors of the present application have found that, upon irradiation with an ultraviolet light having a predetermined power for a predetermined time or longer, the movement of a basal plane dislocation is stopped. Specifically, the inventors of the present application have found that, upon irradiation with an ultraviolet light having a wavelength of 313 nm at an irradiation intensity of 270 mW for 10 seconds, the position of a basal plane dislocation does not move even when being irradiated with an ultraviolet light after that. The silicon carbide epitaxial substrate 100 according to the present embodiment is based on the findings obtained as described above. That is, the silicon carbide epitaxial substrate 100 is manufactured, after depositing the silicon carbide epitaxial layer 11, by being irradiated with an ultraviolet light having a wavelength of 313 nm at an irradiation intensity of 270 mW for 10 seconds.

In the silicon carbide epitaxial substrate 100 according to the present embodiment, because the movement of the basal plane dislocation due to irradiation with an ultraviolet light is stopped, the basal plane dislocation does not move even when further being irradiated with an ultraviolet light having a wavelength of 313 nm at an irradiation intensity of 270 mW for 10 seconds.

Figure 3:
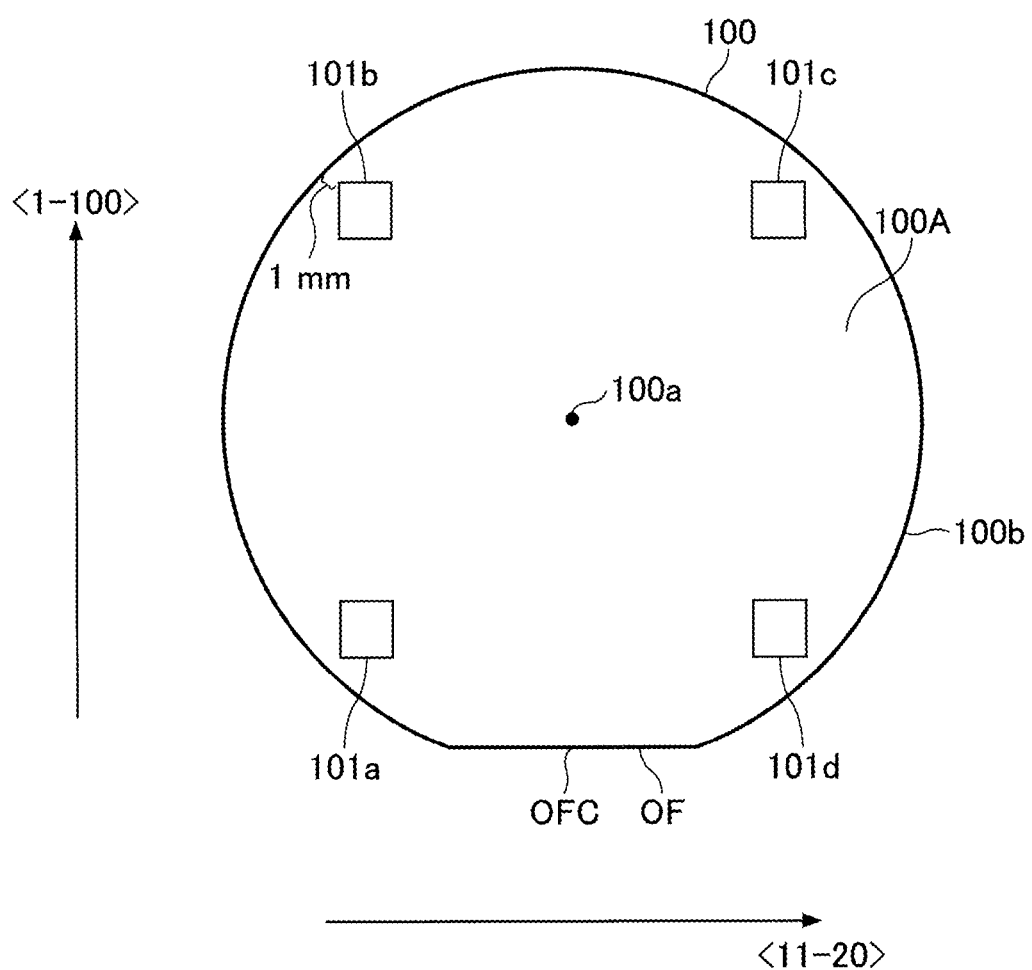
FIG. 3 is a top view schematically illustrating the silicon carbide epitaxial substrate according to one aspect of the present disclosure.

According to the present embodiment, the measurement of whether or not the basal plane dislocation moves is determined by performing the measurement at four measurement areas 101a, 101b, 101c, and 101d of the peripheral portion on the surface of the silicon carbide epitaxial substrate 100 illustrated in FIG. 3. For silicon carbide epitaxial substrates, dislocations such as a basal plane dislocation are more likely to be seen at a peripheral portion than a central portion. Also, for silicon carbide epitaxial substrates with many dislocations such as a basal plane dislocation at a central portion, dislocations such as a basal plane dislocation at a peripheral portion tend to be seen often.

Specifically, the measurement areas 101a, 101b, 101c, and 101d are provided at 45°, 135°, 225°, and 315° in the clockwise direction, with reference to the direction from a center 100a of the silicon carbide epitaxial substrate 100 toward a center OFC of an orientation flat OF. The measurement areas 101a, 101b, 101c, and 101d are square areas of 2.6 mm*2.6 mm in size, and are provided at positions approximately 1 mm away from an edge 100b around the silicon carbide epitaxial substrate 100.

According to the present embodiment, using a mercury xenon lamp mounted on PLI-200 (manufactured by Photon Design Corporation), the silicon carbide epitaxial substrate 100 is irradiated for 10 seconds with an ultraviolet light transmitted through a 313 nm bandpass filter. Note that the power of the ultraviolet light transmitted through the bandpass filter is 270 mW. According to the silicon carbide epitaxial substrate 100 according to the present embodiment, at the measurement areas 101a, 101b, 101c, and 101d, even when being irradiated with the above described ultraviolet light, the basal plane dislocation does not move from the position before being irradiated.

Film Deposition Apparatus

Figure 4:
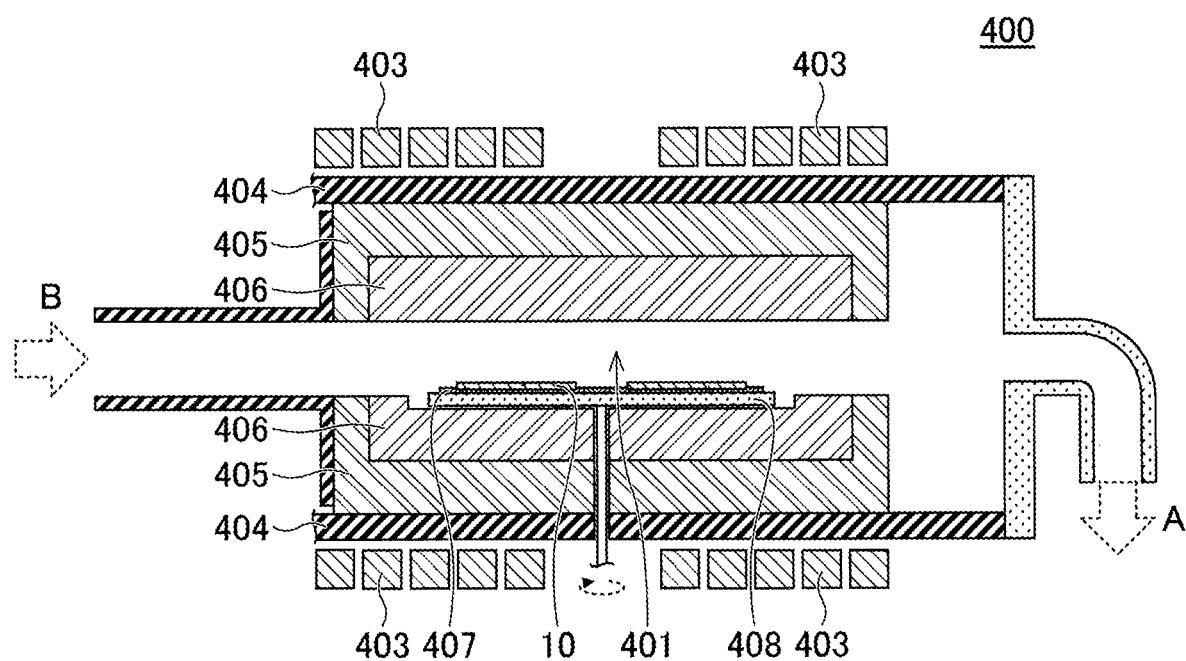
FIG. 4 is a cross-sectional view schematically illustrating an example of a configuration of a film deposition apparatus.
Figure 5:
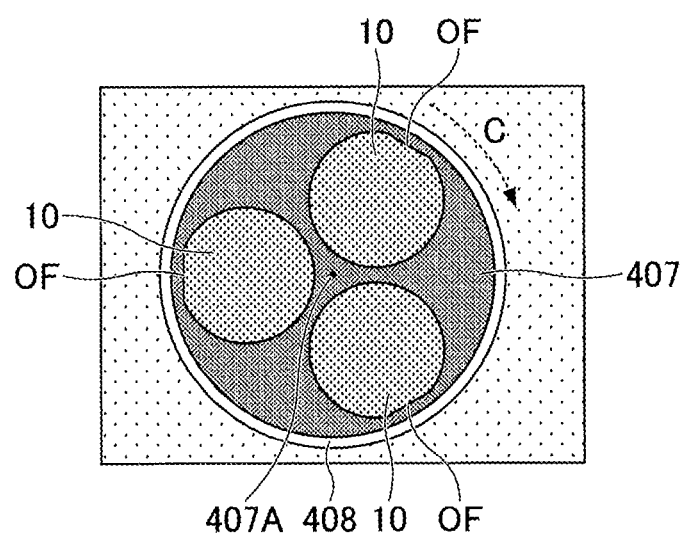
FIG. 5 is a schematic top view illustrating the inside of a chamber of the film deposition apparatus.

Next, a method for manufacturing a silicon carbide epitaxial substrate according to the present embodiment will be described. To begin with, a film deposition apparatus for manufacturing a silicon carbide epitaxial substrate according to the present embodiment will be described with reference to FIG. 4 and FIG. 5. FIG. 4 is a schematic cross-sectional view illustrating an example of a configuration of the film deposition apparatus that is used in the present embodiment. FIG. 5 is a top view of the inside of a chamber of the film deposition apparatus as viewed from above. The film deposition apparatus 400 illustrated in FIG. 4 and FIG. 5 is a horizontal hot wall CVD (Chemical Vapor Deposition) apparatus. As illustrated in FIG. 4, the film deposition apparatus 400 includes induction heating coils 403, a quartz tube 404, a heat insulator 405, and a heating element 406. The heating element 406 is, for example, made of carbon. The heating element 406 is integrally formed so as to have a rectangular tube shape, and inside the rectangular heating element 406, two flat portions are formed so as to face each other. A space surrounded by the two flat portions is a chamber 401. The chamber 401 is also referred to as a "gas flow channel". As illustrated in FIG. 5, on a rotatable susceptor 408 in the chamber 401, a substrate holder 407 on which a plurality of, for example, three, silicon carbide single-crystal substrates 10 can be placed is installed.

The heat insulator 405 is arranged so as to surround the outer circumferential portion of the heating element 406. The chamber 401 is thermally insulated from the outside of the film deposition apparatus 400 by the heat insulator 405. The quartz tube 404 is arranged so as to surround the outer circumferential portion of the heat insulator 405. The induction heating coils 403 are wound around the outer circumferential portion of the quartz tube 404. In the film deposition apparatus 400, the heating element 406 is inductively heated by supplying an alternate current to the induction heating coils 403, and a temperature in the chamber 401 can be controlled. At this time, due to heat insulation by the heat insulator 405, the quartz tube 404 is hardly heated.

In the film deposition apparatus 400 illustrated in FIG. 4, the chamber 401 is evacuated in the direction indicated by the dashed arrow A. Also, at the time of depositing the silicon carbide epitaxial layer 11, a gas containing a carbon component as a material gas, a gas containing a silicon component, hydrogen ($H_2$) gas as a carrier gas, and, as needed, a gas containing a nitrogen component are supplied from the direction indicated by the dashed arrow B. According to the present embodiment, propane ($C_3H_8$) gas or the like is used as the gas containing a carbon component, and silane ($SiH_4$) gas or the like is used as the gas containing a silicon component.

At the time of depositing the silicon carbide epitaxial layer 11, the rotatable susceptor 408 is rotated in the direction indicated by the dashed arrow C about a rotation axis 407A of the substrate holder 407. Thereby, the silicon carbide single-crystal substrate 10 placed on the substrate holder 407 can be revolved. Note that according to the present embodiment, the substrate holder 407 is rotated by rotating the rotatable susceptor 408 about a perpendicular direction, as an axis, with respect to the principal surface 10A of the silicon carbide single-crystal substrate 10. The rotation speed of the rotatable susceptor 408 can be, for example, greater than or equal to 10 RPM and less than or equal to 100 RPM. Accordingly, in the deposition device 400, silicon carbide epitaxial layers 11 can be deposited simultaneously on, a plurality of, for example, three silicon carbide single-crystal substrates 10. Note that the substrate holder 407 is rotated by, for example, a gas flow method.

Method for Manufacturing Silicon Carbide Epitaxial Substrate

Next, a method for manufacturing a silicon carbide epitaxial substrate according to the present embodiment will be described. The method for manufacturing the silicon carbide epitaxial substrate according to the present embodiment will be described with reference to FIG. 6.

Figure 7A:
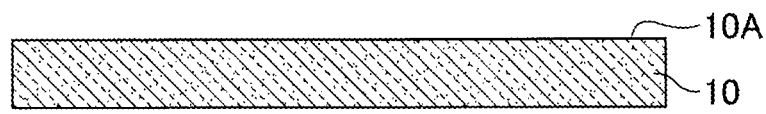
FIG. 7A is a process diagram (1) schematically illustrating the method for manufacturing the silicon carbide semiconductor device according to one aspect of the present disclosure.

First, a preparation process (S102) is performed to prepare a silicon carbide single-crystal substrate 10. The silicon carbide single-crystal substrate 10 is produced by slicing an ingot of a silicon carbide single crystal. For example, a wire saw is used to slice the ingot of the silicon carbide single crystal. FIG. 7A schematically illustrates the silicon carbide single-crystal substrate 10 sliced in this manner.

The silicon carbide single-crystal substrate 10 includes a principal surface 10A on which a silicon carbide epitaxial layer 11 is to be grown later. The silicon carbide single-crystal substrate 10 has an off angle θ that is greater than 0° and less than or equal to 6°. In other words, the principal surface 10A is a surface inclined by an off angle θ that is greater than 0° and less than or equal to 6° from a predetermined crystal plane. By introducing the off angle θ into the silicon carbide single-crystal substrate 10, when the silicon carbide epitaxial layer 11 is grown by a CVD method, a lateral growth from an atomic step that appears on the principal surface 10A, a called "step flow growth," is induced. Thus, a single crystal grows while inheriting a polytype of the silicon carbide single-crystal substrate 10, thereby inhibiting a different type of polytype from being mixed. Here, the predetermined crystal plane is preferably a (0001) plane or a (000-1) plane. In other words, the predetermined crystal plane is preferably a {0001} plane. A direction in which an off angle is provided is a <11-20> direction.

Next, a decompression process (S104) is performed. In the decompression process (S104), as illustrated in FIG. 4 and FIG. 5, the silicon carbide single-crystal substrate 10 is placed in the chamber 401 of the film deposition apparatus 400, and the pressure in the chamber 401 is decreased. The silicon carbide single-crystal substrate 10 is placed on the rotatable susceptor 408 in the chamber 401. The rotatable susceptor 408 may be coated with a SiC coating or the like.

FIG. 8 is a timing chart illustrating a temperature and a gas flow rate in the chamber 401 from the decompression process (S104) to the cooling process (S110). In FIG. 8, the decompression process (S104) corresponds to a period from time t1 when the decompression of the chamber 401 starts after the silicon carbide single-crystal substrate 10 is placed in the chamber 401 to time t2 when the pressure in the chamber 401 reaches a targeted value. The targeted value of the pressure in the decompression process (S104) is, for example, about $1*10^{-6}$ Pa.

Next, a temperature rising process (S106) is performed. In the temperature rising process (S106), the temperature in the chamber 401 of the film deposition apparatus 400 is heated to a second temperature T2. In the temperature rising process (S106), after the temperature passes a first temperature T1 that is lower than the second temperature T2, the temperature reaches the second temperature T2. As illustrated in FIG. 8, the temperature rising starts from time t2; the temperature in the chamber 401 reaches the first temperature T1 at time t3; and the temperature in the chamber 401 further reaches the second temperature T2 at time t4.

The first temperature T1 is, for example, 1100° C. Also, the second temperature T2 is preferably greater than or equal to 1500° C. and less than or equal to 1700° C. When the second temperature T2 is below 1500° C., it may be difficult to uniformly grow a single crystal in an epitaxial growth process (S108) that will be described later, and the growth rate may decrease. Also, when the second temperature T2 is greater than 1700° C., an etching action by hydrogen gas becomes intense, and the growth rate may decrease. The second temperature T2 is more preferably greater than or equal to 1520° C. and less than or equal to 1680° C., and is particularly preferably greater than or equal to 1550° C. and less than or equal to 1650° C. According to the present embodiment, the second temperature T2 is 1630° C.

According to the present embodiment, as illustrated in FIG. 8, from time t3 when the temperature in the chamber 401 reaches the first temperature T1, hydrogen ($H_2$) gas is supplied into the chamber 401 and the pressure in the chamber 401 is set to be a predetermined pressure, for example, 8 kPa. The hydrogen gas is supplied such that the flow rate of the hydrogen gas becomes 120 slm.

Next, an epitaxial growth process (S108) is performed. In the epitaxial growth process (S108), together with the hydrogen gas, a hydrocarbon gas and silane ($SiH_4$) gas are supplied into the chamber 401 of the film deposition apparatus 400. The predetermined pressure in the chamber 401 in the epitaxial growth process (S108) is, for example, 8 kPa. Thus, the silicon carbide epitaxial layer 11 can be grown on the principal surface 10A of the silicon carbide single-crystal substrate 10.

Methane ($CH_4$) gas, ethane ($C_2H_6$) gas, propane ($C_3H_8$) gas, butane ($C_4H_{10}$) gas, acetylene ($C_2H_2$) gas, and the like can be used as the hydrocarbon gas. Among these hydrocarbon gases, a single kind of gas may be used alone, or two or more kinds may be mixed to be used. In other words, the hydrocarbon gas preferably contains one or more kinds selected from the group consisting of methane gas, ethane gas, propane gas, butane gas and acetylene gas. A flow rate of the hydrocarbon gas is preferably greater than or equal to 5 sccm and less than or equal to 30 sccm. According to the present embodiment, for example, propane gas is supplied as the hydrocarbon gas at 15 sccm.

Moreover, the flow rate of the silane gas is not specifically limited, but the flow rate of the silane gas is preferably adjusted such that a ratio (C/Si) of a number of carbon (C) atoms contained in the hydrocarbon gas to a number of silicon (Si) atoms contained in the silane gas becomes 0.5 or more and 2.0 or less. This is for an epitaxial growth of SiC having an appropriate stoichiometric ratio. According to the present embodiment, for example, the silane gas is supplied at 45 sccm.

Figure 7B:
FIG. 7B is a process diagram (2) schematically illustrating the method for manufacturing the silicon carbide semiconductor device according to one aspect of the present disclosure.

In the epitaxial growth process (S108), nitrogen ($N_2$) and the like may be supplied as a dopant. The epitaxial growth process (S108) is started at time t4 to time t5 in accordance with a targeted thickness of the silicon carbide epitaxial layer 11. FIG. 7B schematically illustrates a silicon carbide epitaxial substrate in which the silicon carbide epitaxial layer 11 is deposited on the principal surface 10A of the silicon carbide single-crystal substrate 10.

Next, a cooling process (S110) is performed. In the cooling process (S110), heating is stopped at time t5 when the epitaxial growth process (S108) is completed, and cooling is performed while the flow rate of hydrogen gas is supplied. At that time, the predetermined pressure in the chamber 401 is, for example, 8 kPa. Thereafter, the supply of the hydrogen gas is stopped at time t6 when the temperature T3 becomes 600° C., and cooling is performed until time t7 when the silicon carbide epitaxial substrate becomes able to be taken out at the temperature. After reaching time t7, the inside of the chamber 401 is opened to atmosphere, the inside of the chamber 401 is returned to atmospheric pressure, and the silicon carbide epitaxial substrate is removed from the inside of the chamber 401.

Figure 7C:
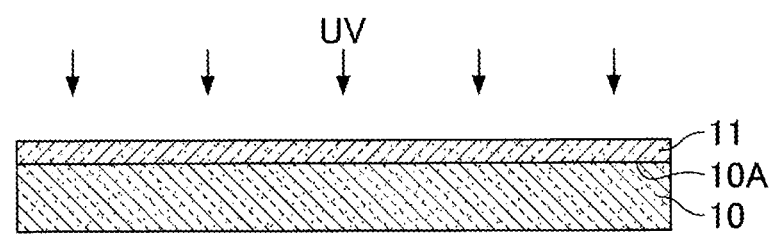
FIG. 7C is a process diagram (3) schematically illustrating the method for manufacturing the silicon carbide semiconductor device according to one aspect of the present disclosure.

Next, a basal plane dislocation stabilization process (S112) is performed. In the basal plane dislocation stabilization process S112, the surface of the silicon carbide epitaxial layer 11 of the silicon carbide epitaxial substrate on which the silicon carbide epitaxial layer 11 is deposited is irradiated with an ultraviolet light. Specifically, using a mercury xenon lamp, the surface of the silicon carbide epitaxial layer 11 is irradiated with an ultraviolet light transmitted through a 313 nm bandpass filter and having an intensity of 270 mW for 10 seconds. Thereby, the basal plane dislocation, which moves by irradiation with an ultraviolet light, no longer moves and the position of the basal plane dislocation is stabilized. FIG. 7C schematically illustrates a state in which the surface is irradiated with an ultraviolet light where the silicon carbide epitaxial layer 11 of the silicon carbide epitaxial substrate is deposited.

Through the above processes, the silicon carbide epitaxial substrate according to the present embodiment can be manufactured.

Note that although a case has been described above in which the basal plane dislocation, which moves by irradiation with an ultraviolet light, is stabilized by irradiation with an ultraviolet light, if it is possible to stabilize the position of the basal plane dislocation, irradiation may be performed with light having another wavelength or electromagnetic waves or the like.

Although the embodiment has been described above in detail, it is not limited to a specific embodiment, and various modifications and changes can be made within the scope described in claims.

DESCRIPTION OF THE REFERENCE NUMERALS

10 silicon carbide single-crystal substrate
10A principal surface
10B back surface
11 silicon carbide epitaxial layer
11A surface
100 silicon carbide epitaxial substrate
100A surface
101a, 101b, 101c, 101d measurement area
110 basal plane dislocation
400 film deposition apparatus
401 chamber
403 induction heating coil
404 quartz tube
405 heat insulator
406 heating element
407 substrate holder
408 rotatable susceptor

The invention claimed is:

1. A method of manufacturing a silicon carbide epitaxial substrate, the method comprising:
    preparing a silicon carbide single-crystal substrate having a polytype of 4H and having a principal surface inclined at an angle θ from a {0001} plane in a <11-20> direction;
    growing a silicon carbide epitaxial layer on the principal surface having a basal plane dislocation, the basal plane dislocation having a portion extending in a <1-100> direction and a portion extending in a <11-20> direction; and
    irradiating the silicon carbide epitaxial layer with an ultraviolet light having a predetermined power and a predetermined wavelength for a predetermined period of time to stabilize the basal plane dislocation;
    wherein after the irradiating, the basal plane dislocation does not move even when the basal plane dislocation is irradiated with an ultraviolet light having a power of 270 mW and a wavelength of 313 nm for 10 seconds.

2. The method according to claim 1, wherein the predetermined power is 270 mW or more, the predetermined wavelength is 313 nm or less, and the predetermined period of time is 10 seconds or more.

3. The method according to claim 1, wherein the predetermined power is 270 mW, the predetermined wavelength is 313 nm, and the predetermined period of time is 10 seconds.

4. The method according to claim 1, wherein a diameter of the silicon carbide single-crystal substrate is greater than or equal to 150 mm.

5. The method according to claim 1, wherein the angle θ is greater than 0° and less than or equal to 6°.

* * * * *